Figure 1:
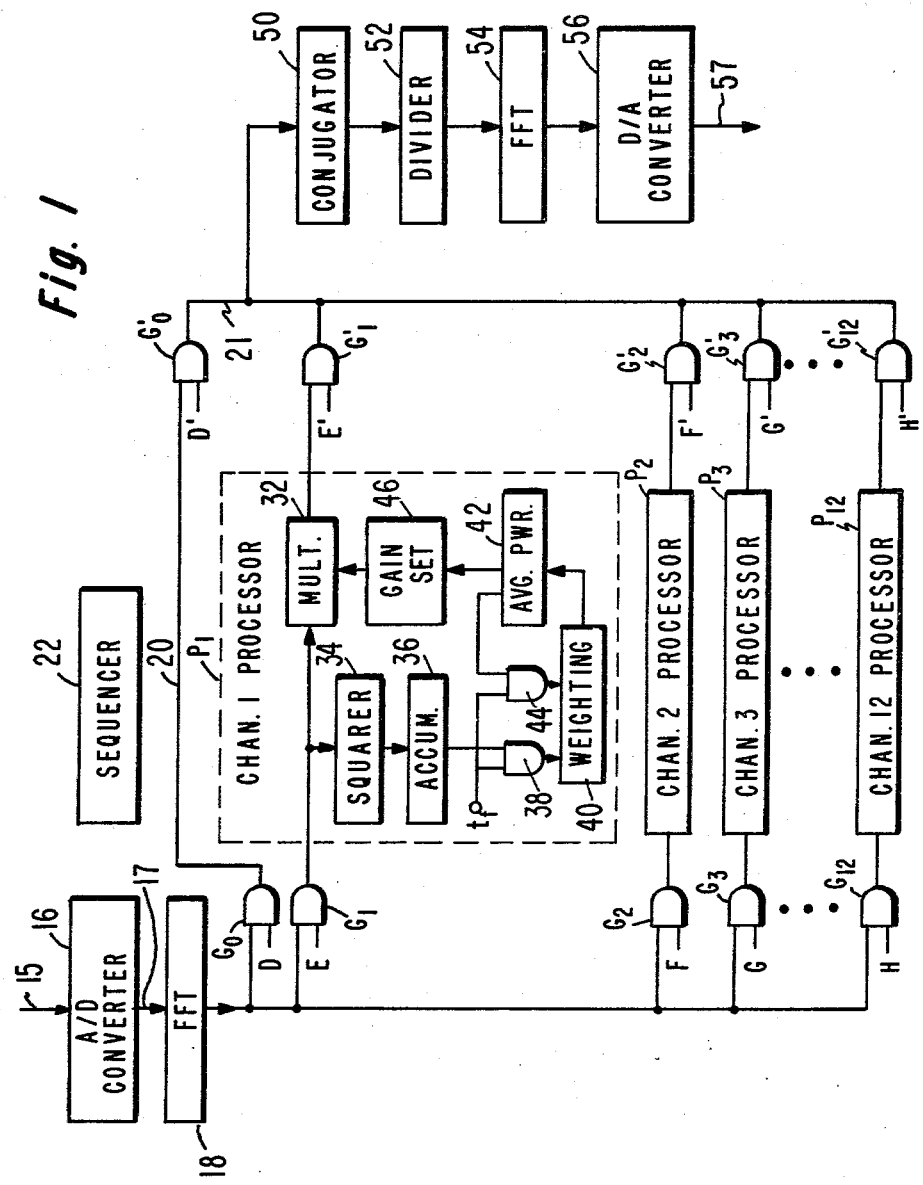

United States Patent [19]

Schiff

[11] 4,221,934
[45] Sep. 9, 1980

[54] COMPANDOR FOR GROUP OF FDM SIGNALS

[75] Inventor: Leonard N. Schiff, Trenton, N.J.

[73] Assignee: RCA Corporation, New York, N.Y.

[21] Appl. No.: 38,185

[22] Filed: May 11, 1979

[51] Int. Cl.² ............................................. H04J 1/02
[52] U.S. Cl. ...................................... 370/7; 370/23; 370/70
[58] Field of Search ........ 179/15 AV, 15 FD, 15 FS, 179/15 BW; 364/724, 726

[56] References Cited

U.S. PATENT DOCUMENTS

| | | | |
|---|---|---|---|
| 3,560,659 | 2/1971 | Greefkes | 179/15 AV |
| 4,101,738 | 7/1978 | Bellanger et al. | 179/15 FD |

Primary Examiner—Douglas W. Olms
Attorney, Agent, or Firm—Samuel Cohen; Carl V. Olson

[57] ABSTRACT

A system to individually compress the volume range of each voice signal in a group of frequency-division-multiplexed voice signals, without frequency dividing the voice signals into separate channels, includes, in order: a sampler to sample the group of voice signals, an analog-to-digital converter to convert each analog sample a first fast Fourier transform processor producing coefficients, means to direct coefficients representing individual voice signals to respective individual signal channels in which the signal levels are compressed, a second fast Fourier transform processor, and a digit-to-analog converter and band-pass filter to produce an analog group of frequency-division multiplexed voice signals like the original signals but with each voice signal individually compressed in volume range.

9 Claims, 2 Drawing Figures

COMPANDOR FOR GROUP OF FDM SIGNALS

This invention relates to compandors used to compress the volume range of a voice signal at a transmitting terminal, and to expand (restore) the volume range of the voice signal at a receiving terminal, for the purpose of improving the signal-to-noise ratio of the received signal. More particularly, the invention relates to a system for companding each voice signal in a group of frequency-division-multiplexed (FDM) voice signals, without frequency dividing the voice signals into separate channels.

It is common to transmit a group of telephone voice signals to distant places on a single high frequency carrier wave. For example, twelve voice signals each in a frequency range of 0 to 4,000 Hz may be frequency division multiplexed (FDM) to non-overlapping frequency ranges in a total frequency range of 60 KHz to 108 KHz. The combined or group signal having frequencies between 60 to 108 KHz may then be used to frequency modulate (FM) a high frequency, or radio frequency, subcarrier or carrier wave. At the receiving terminal, the subcarrier or carrier is demodulated, and the twelve voice signals are demultiplexed for distribution to twelve individual destinations.

The signal-to-noise improvement obtained by companding may be had by the use of a volume range compressor at each telephone voice-signal source, and a volume range expandor at each telephone signal destination. The theory of, and apparatus for, companding are described in chapter 28, "Syllabic Companding and TASI", pp. 677–683 of the book, *Transmission Systems For Communications*, 1970, published by Bell Telephone Laboratories, Inc. If it is desired to compress the volume ranges of the twelve voice signals after they have been frequency-division-multiplexed, it has been necessary to demultiplex the twelve voice signals onto twelve separate channels, perform the volume range compression of the voice signal in each channel, and then re-multiplex the volume-range-compressed outputs of the twelve channels. The requisite demultiplexing and re-multiplexing apparatus is complex and expensive, giving rise to a need for a less expensive means to compress the volume ranges of each voice signal in a group of frequency-division-multiplexed voice signals.

According to an example of the invention, a digital input signal representing a group of frequency-division-multiplexed individual signals is applied to a first fast Fourier transform processor to translate the digital signal to a coefficient signal. A commutator means connects portions, corresponding with respective individual signals, of said coefficients signal in time sequence to and through a group of corresponding parallel channels. Each channel includes means to compress the volume range of signals therein. A second fast Fourier transform processor translates the combined compressed coefficients signal to a signal like the input signal but with each individual signal compressed in volume range.

Figure 2:
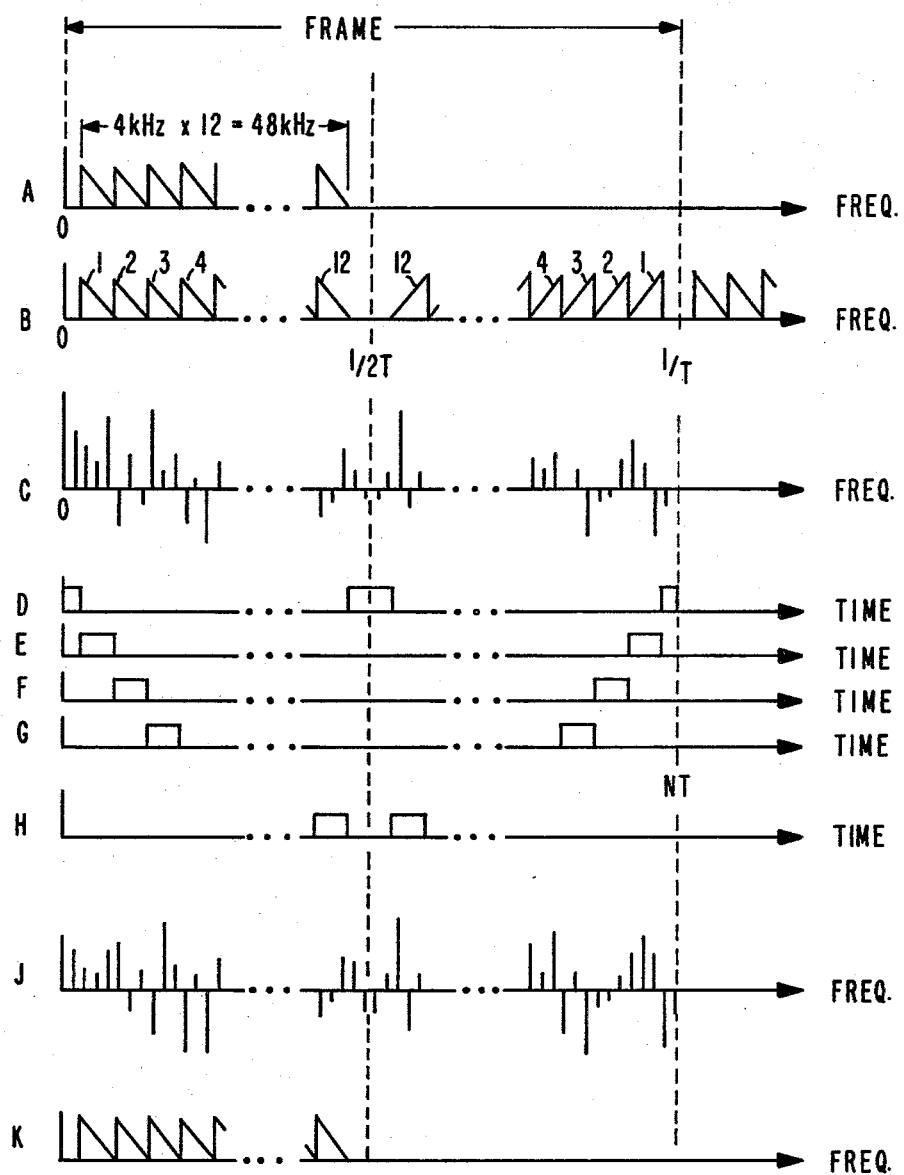

In the drawing:

FIG. 1 is a block diagram of a compressor portion, or an expandor portion, of a compandor system constructed according to the teachings of the invention; and FIG. 2 is a chart which will be referred to in describing the operation of the apparatus of FIG. 1.

Referring now in greater detail to FIG. 1, the exemplary group of twelve frequency-division-multiplexed voice signals occupying a frequency range from 60 to 108 KHz is heterodyned by conventional means not shown to a 48 KHz frequency range from about 1 KHz to about 49 KHz, which is applied at 15 to the input of a sampling analog-to-digital (A/D) converter 16. The input signal at 15 is represented in the frequency domain (Fourier transform) at FIG. 2A where each triangular portion symbolically represents the envelope of the frequency components of one 0–4 KHz voice signal.

The sampling A/D converter 16 samples the analog FDM group of voice signals at a sampling rate greater than the Nyquist rate which is twice the highest frequency in the 49 KHz range of frequencies. The sampling rate is $1/T$, where T is the time between samples. N samples occur during each "frame" illustrated in FIG. 2. A sampling rate is selected such that $1/NT$ is an integer submultiple of the voice channel spacing, so that an equal number of samples is associated with each of the twelve voice signals. Accordingly, the samples N per frame may equal $2^{10}$ or 1024, for example. The sampling process in converter 16 results in a frequency spectrum as shown by FIG. 2B.

The converter 16 includes an A/D converter which translates each analog sample into an equivalent value in digital form which is suitable for application over line 17 to a fast Fourier transform (FFT) processor 18. Each sample is represented by a plurality of m bits in a pulse code modulation (PCM) code on an m-bit bus. The value of m should be greater than eight to avoid round-off errors. The converter 16 may be as described in U.S. Pat. No. 3,993,992, "Circuit Arrangement For Converting Analog Signals Into PCM Signals and PCM Signals Into Analog Signals" issued on Nov. 23, 1976, to Edward Zwack.

The fast Fourier transform (FFT) processor 18 is a pipeline FFT, the theory and construction of which may be as described in chapter 9 entitled "Fast Fourier Transform" by Sheats in the book *Radar Technology* edited by Eli Brookner and published in 1977 by Airtech House, Inc., 610 Washington Street, Dedham, MA 02026. Reference is also made to U.S. Pat. No. 3,816,729, "Real Time Fourier Transformation Apparatus", issued on June 11, 1974 to George A. Work of the Raytheon Company. The FFT processor 18 operates on successive frames of PCM coded samples from converter 16, where each frame contains N samples. Since the time between samples is T, the period of one frame is NT. The number N of samples per frame should be an integral power of 2, i.e., a number in the binary system. Factors to consider in selecting a value for N are given in Appendix A.

The output of the FFT processor 18 is a set of coefficients, representing a Fourier transform which are made available as a time ordered set of coefficients. FIG. 2C is a simplified representation of the coefficients in the output 19 from the FFT processor 18 corresponding with each digital signal sample from the A/D converter 16. Only three coefficients per each of the twelve 4 KHz-wide voice signal are shown in FIG. 2C to represent a much larger number. Also, the representation in FIG. 2C does not reflect the fact that each coefficient is a complex number in the form $a+bi$ where a and b are real numbers and i is defined as $\sqrt{-1}$. Each of the numbers a and b of a coefficient is represented by an m-bit PCM code.

FIGS. 2C through 2H are useful for illustrating the fact that the coefficients corresponding with the twelve voice signals occur at respective non-overlapping time periods, so that they can be separated on the basis of time into twelve separate signal channels. Waveform 2E shows the time periods when coefficients corresponding with voice signal 1 are present. Waveforms 2F, 2G and 2H show the time periods when coefficients corresponding with voice signals 2, 3, 4 and 12 are present. Waveform 2D shows the time periods at the beginning, the middle, and the end of a frame when coefficients corresponding with no voice signals are present.

In FIG. 1, the coefficients on bus 19 corresponding with the twelve voice signals are directed in time division fashion to twelve respective channels channel processors $P_1$, $P_2$, $P_3$ through $P_{12}$ by means of gates $G_1$, $G_2$, $G_3$ through $G_{12}$ which are enabled by timing signals E, F, G through H from a sequencer 22 over paths not shown. In addition, the coefficients not corresponding with any of the twelve voice signals are directed over a direct parallel path 20 to a summation bus 21 by means of a gate $G_0$ enabled by timing signal D from the sequencer 22, and a gate $G'_0$ enabled by a delayed timing signal D'. The outputs of the twelve channel processors $P_1$, $P_2$, $P_3$ through $P_{12}$ are connected to the summation bus 21 through gates $G'_1$, $G'_2$, $G'_3$ through $G'_{12}$ enabled by delayed timing signals $D'_1$, E', F', G' through H'. The output gates are enabled sufficiently later than the input gates to allow completion of volume range compression processing in the channels.

Each of the twelve channel processors is like processor $P_1$ in including an input bus 30 coupling coefficients through a multiplier or gain control unit 32 and an output gate such as $G'_1$, to the summation bus 21. The input coefficients appearing during one frame are multiplied in multiplier 32 by a number which is constant during the period of one frame. The multiplying number is derived by a squarer 34 which squares the input coefficients producing values corresponding with the power or energy of the coefficients. The values are summed in an accumulator 36. At the end of each frame period, at time $t_f$, the contents of the accumulator is gated by gate 38 to a weighting means 40, and the contents of an average power register 42 is gated through gate 44 to the weighting means 40. The gating pulse applied to gates 38 and 44 at time $t_f$ is identified as $t_f$ in the figure. The weighting means combines the two inputs in a predetermined ratio and supplies the result back to the average power register 42. The new value in the register 42 is applied to a gain getting means 46 which provides a multipler number to multiplier or gain control unit 32 to determine how much all the coefficients are amplified during the next frame.

In the operation of the processor $P_1$ during the period of a frame, each coefficient number supplied on input bus 30 is magnitude squared at 34 and summed in accumulator 36. In other words, at the end of each frame, the accumulator contents is the sum of the squares of the magnitude of the discrete Fourier transform (DFT) sequence numbers that pertain to the first voice signal. This value is the discrete version of integrating the magnitude square of a Fourier transform. Hence, by Parcevals theorem, the accmulator contents at the end of the frame is proportional to the average energy (during the frame period) of the voice channel that that accumulator corresponds to. Use is made of the property that the short term energy or volume of a signal can be measured via its frequency spectrum. The average power register 42 has a numerical value which represents the average power of that voice signal over the time of many frames. At the end of every frame, its value must be updated. At the end of every frame (at time $t_f$), the present output of the average power register and the present value in the accumulator 36 are gated to the weighting network 40. This network forms the output equal to a times (accumulator value) plus b times (average power register value), and gates this value to the average power register 42. The thus updated value of average power is used during the next frame. The value of the number in the average power register is used to set the gain or multiplier value during the next frame. Because of the PCM format, the actual conversion from register contents to gain used can be implemented via a look-up table. In fact, the entire processor $P_1$ may be constituted by microprocessor. In the volume range compressor being described, a high gain is provided when the average power is low. The formula for gain vs. power is exactly the same as in a normal compressor. It should be pointed out that a and b in the formula above are real positive numbers that sum to unity. The relative values determine the time constant of the gain setting loop exactly as if it were an RC circuit. The larger b is (and hence the smaller a is), the larger the time constant. The parameters a and b can then be set to match a given time constant.

What has been described with regard to channel 1 processor $P_1$, applies as well to each individual one of the other eleven processors. Therefore, the output of all processors time division multiplexed on bus 21 is now the same as if each of the individual voice frequency signals had been passed through a compressor at voice frequency, and the discrete Fourier transform taken of all the voice signals after they were frequency-division-multiplexed together. The signals on bus 21 are suggested by FIG. 2J to be like the signals shown by FIG. 2C, but with the coefficients corresponding to each voice signal being compressed by an individual respective amount.

The number sequence on bus 21 is applied to a conjugator 50, which simply changes the sign bit of each imaginary part of each number. The conjugated sequence is applied to a divider 52, which divides the number by a scaling factor which is the number N of samples per frame. The division is accomplished by simply a shift of $\log_2 N$ bits. The divided number sequence is then applied to a fast Fourier transform processor 54 which is identical with the FFT processor 18. The number sequence emerging from FFT processor 54 is a sequence of real pulse code modulation (PCM) numbers which is converted back to a pulse amplitude modulated (PAM) sequence for application to a D/A converter 56. In the converter 56, the digital number sequence is converted to a sequence of analog signals which are translated by filtering to a frequency-division-multiplexed group of voice signals at 57 in the about 1 to about 49 KHz range (as illustrated in FIG. 2K) like the input signal at 15, but with each individual voice signal compressed in volume range for transmission to a distant point.

At the distant receiving terminal, the received signal can be de-multiplexed to individual voice channels each including a conventional expander to restore the volume range to the original amount. Alternatively, the received signal can be applied to an expanding system exactly the same as the compressing system shown in FIG. 1 except that the gain setting means 46 causes the gain to be low when the average power is high. This is just the reverse of the action performed by the gain setting means at a transmitting terminal.

APPENDIX A

Factors to consider in selecting a value N of samples per frame are as follows: Cost considerations dictate that N be as small as possible. As is known, the cost of an FFT processor is proportional to $N \log_2 N$ and two such processors are used in the system of FIG. 1. Even if cost were not a consideration, a value of N that is very large will result in gain settings that are inaccurate. Compandor action is supposed to track values of the speech and adjust gain accordingly. Since gain is set once per N samples, if N is too large the volume cannot be tracked properly. In effect, the time constant of the tracking will be too large regardless of the coefficients a and b. On the other hand, if N is too small, the gain coefficients will be inaccurately set also but for a different reason. In considering an FFT, we associate certain coefficients with certain voice channels (or segments of the frequency band). This is a useful point of view but the value of the coefficient will depend to a small extent on what is happening in neighboring channels. If all the channels are quiet (zero signal) but one (which carries a sine wave), we would like only the coefficients of that channel to be non-zero and the others zero. In effect, a sine wave in one of the channels causes all the coefficients to be non-zero. The ones that are significantly different from zero are the first few coefficient on either side of the coefficient closest to that frequency (and likewise for the mirror image portion of the spectrum). For small N, a few coefficients will bring one to coefficients in the other channels. For large enough N, there are actually a number of coefficients in the spaces between channels (there are small guard bands in the FDM multiplex group). These insure that all the coefficients associated with a channel are not significantly different from zero if that channel is quiet, regardless of what is happening in the other channels. This problem of making N high enough to avoid "inter channel crosstalk" is one gain setting. If all the gains were frozen at a given value (the same for all twelve) there would not be a problem regardless of how low N were made because the second FFT device would undo the crosstalk effect. The difficulty is that each channel is brought through a different gain and the second FFT device won't undo the effect in this case. Further the gain is controlled by the coefficients themselves and one does not want a situation where the gain in one channel is dependent on the signal in the other channels.

What is claimed is:
1. The combination of
   a source of a digital input signal representing a group of frequency-division-multiplexed individual signals,
   a first fast Fourier transform processor to translate said digital signal to a coefficients signal,
   a group of parallel channels each including means to compress the volume range of signals therein,
   commutator means connecting portions, corresponding with respective individual signals, of said coefficients signal in time sequence to and through said group of corresponding parallel channels to a common output terminal, and
   a second fast Fourier transform processor to translate the compressed coefficients signal to a signal like the input signal but with each individual signal compressed in volume range.
2. The combination of claim 1 wherein said individual signals represent voice signals.
3. The combination of claim 1 wherein said source of a digital input signal is a source of a pulse code modulation signal on a plurality of parallel conductors.
4. The combination of claim 1 wherein said source of a digital input signal includes means to sample an analog signal, and an analog-to-digital converter.
5. The combination of claim 4 wherein said first fast Fourier transform processor is constructed to operate on frames of N samples per frame.
6. The combination of claim 5 wherein said commutator means includes means to conjugate the combined signal from said output terminal.
7. The combination of claim 6 wherein said commutator means includes means to divide the conjugated signal by the number N of samples per frame.
8. The combination of claim 7, and in addition, a digital-to-analog converter receptive to the output of said second fast Fourier transform processor.
9. Means to individually compress the volume range of each voice signal in a group of frequency-division multiplexed voice signals, without frequency dividing the voice signals into separate channels, comprising
   a sampler to sample said group of voice signals at a sampling rate 1/T at least equal to the Nyquist rate,
   an analog-to-digital converter to convert each analog sample to an m-bit PCM digital signal on m lines,
   a first fast Fourier transform processor operating on frames of N digital signal samples per frame of NT duration to produce output digital sample signals in which sample signals corresponding with individual voice signals occur in separate ordered time slots,
   gating means to direct digital signals representing individual voice signals in said time slots to respective individual signal channels,
   means in each channel to compress the signal level therein,
   means to combine the outputs in different time slots of all channels,
   means to conjugate the combined signal,
   means to divide the conjugated signal by the number N of samples per frame,
   a second fast Fourier transform processor receptive to said conjugated and divided signal to produce an output digital signal corresponding with said group of voice signals, and
   a digit-to-analog converter and band-pass filter receptive to the output of said second fast Fourier transform processor to produce an analog group of frequency-division multiplexed voice signals like the original signals but with each voice signal individually compressed in volume range.

* * * * *